United States Patent
Simonelli et al.

(10) Patent No.: US 7,902,009 B2
(45) Date of Patent: Mar. 8, 2011

(54) GRADED HIGH GERMANIUM COMPOUND FILMS FOR STRAINED SEMICONDUCTOR DEVICES

(75) Inventors: Danielle Simonelli, Beaverton, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 12/316,510

(22) Filed: Dec. 11, 2008

(65) Prior Publication Data

US 2010/0148217 A1    Jun. 17, 2010

(51) Int. Cl.
*H01L 21/00* (2006.01)
(52) U.S. Cl. .......................... 438/166; 438/173
(58) Field of Classification Search .................. 438/176
See application file for complete search history.

(56) References Cited

U.S. PATENT DOCUMENTS

| 7,348,232 | B2 * | 3/2008 | Chidambaram et al. ...... 438/199 |
| 2004/0087117 | A1 | 5/2004 | Leitz et al. |
| 2006/0113542 | A1 | 6/2006 | Isaacson et al. |
| 2007/0235802 | A1 | 10/2007 | Chong et al. |
| 2008/0073723 | A1 | 3/2008 | Rachmady |
| 2008/0242037 | A1 | 10/2008 | Sell |
| 2009/0075029 | A1 * | 3/2009 | Thomas et al. ............... 428/173 |

FOREIGN PATENT DOCUMENTS

WO    2010/068530 A2    6/2010

OTHER PUBLICATIONS

International Search Report/Witten Opinion for Patent Application No. PCT/US2009/066334, mailed Jun. 22, 2010, 11 pages.

* cited by examiner

*Primary Examiner* — Bradley K Smith
*Assistant Examiner* — Tony Tran
(74) *Attorney, Agent, or Firm* — Scott M. Lane (57) ABSTRACT

Embodiments of an apparatus and methods for providing a graded high germanium compound region are generally described herein. Other embodiments may be described and claimed.

10 Claims, 7 Drawing Sheets

GRADED HIGH GERMANIUM COMPOUND FILMS FOR STRAINED SEMICONDUCTOR DEVICES

FIELD OF THE INVENTION

The field of invention relates generally to the field of semiconductor integrated circuit manufacturing and, more specifically but not exclusively, relates to planar and three-dimensional complementary metal oxide semiconductor (CMOS) devices comprising a compound layer with graded germanium content.

BACKGROUND INFORMATION

In a conventional metal oxide semiconductor (MOS) field effect transistor, the source, channel, and drain structures are constructed adjacent to each other within the same plane. Typically, a gate dielectric is formed on the channel area and a gate electrode is deposited on the gate dielectric. The transistor is controlled by applying a voltage to the gate electrode, thereby allowing a current to flow through the channel between source and drain.

An alternative to methods of building planar MOS transistors is applied to alleviate some of the physical barriers to scaling down planar designs. The alternative method involves the construction of three dimensional MOS transistors, in the form of a multi-gate transistor such as a dual-gate field effect transistor (FinFET) or a tri-gate field effect transistor as a replacement for the conventional planar MOS transistor.

Three-dimensional transistor designs such as the FinFET and the tri-gate field effect transistor allow tighter packing of the same number of transistors on a semiconductor chip by using vertical or angled surfaces for the gates. A tri-gate field effect transistor comprises three substantially equal length gates situated on three exposed surfaces of a body whereas a FinFET comprises two equal length gates situated along the sides of a narrow body, or fin.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

In various embodiments, various embodiment of an apparatus and methods of forming a compound layer with graded germanium content on a substrate are illustrated and described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Performance of planar and multi-gate MOS transistors can be improved through implementation of a graded high-germanium content compound, such as a silicon-germanium alloy in the source and drain regions of the transistor. It would be an advance in the art of semiconductor device manufacturing to provide a method to selectively form a graded high-germanium content region of silicon-germanium material with a desired crystal structure at a desirable film growth rate. It would be a further advance in the art to selectively form a graded high germanium content silicon-germanium region with enhanced within wafer-uniformity of layer thickness and germanium concentration. Further, it would be an advance in the art to grow the graded high germanium content silicon-germanium region at a growth rate that is cost effective in a manufacturing environment. As an example, use of a strained high germanium compound film including a graded transition layer in the source/drain (S/D) regions of a pMOS device can provide the combined effect of contact resistance reduction and mobility enhancement resulting from the strained configuration. More specifically, it would be an advance in the art to provide a graded transition layer with full strain at or near theoretical limits of germanium concentration. These benefits may result from the apparatus and methods described below.

Figure 1:
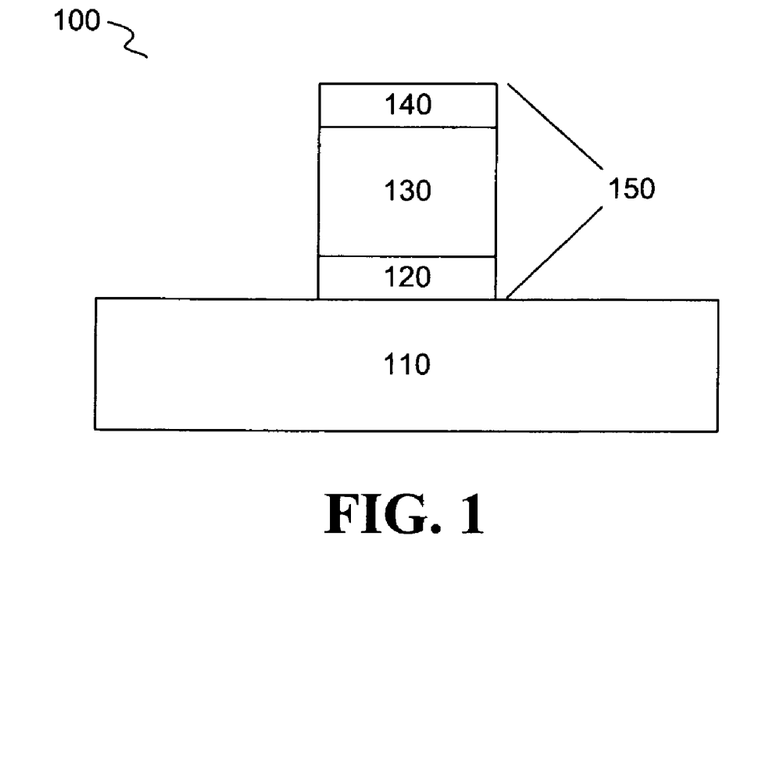
FIG. 1 is a cross-sectional view of a planar MOS device illustrating a gate electrode on a substrate.

Now turning to the figures, FIG. 1 is a cross-sectional view of a planar MOS device 100 illustrating a gate stack 150 on a substrate 110. The substrate 110 may comprise bulk silicon optionally including a silicon-on-insulator substructure. Alternatively, substrate 110 may comprise other materials—which may or may not be combined with silicon—such as: germanium, indium antimonide, lead telluride, indium arsenide, indium phosphide, gallium arsenide, or gallium antimonide. Although a few examples of materials from which substrate 110 may be formed are described here, any material that may serve as a foundation upon which a semiconductor device may be built falls within the scope of the present invention.

In the implementation described here, the gate stack 150 may include a gate dielectric layer 120 and a sacrificial gate electrode 130. In other implementations, the gate stack 150 may include a silicon dioxide gate dielectric layer and a polysilicon gate electrode. The gate dielectric layer 120 may be formed from materials such as silicon dioxide or high-k dielectric materials. Examples of high-k gate dielectric materials that may be used include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, the gate dielectric layer 120 may be between around 5 Angstroms (Å) to around 50 Å thick. In further embodiments, additional processing may be performed on the gate dielectric layer 120, such as an annealing process to improve the quality of a high-k material.

The gate stack 150 may also include a gate hard mask layer 140 that provides certain benefits or uses during processing, such as protecting the gate electrode 130 from subsequent ion implantation processes. In implementations of the invention, this hard mask layer 140 may be formed using materials conventionally used as hard masks, such as conventional dielectric materials. After the gate stack is formed, an ion implantation process is carried out to form doped portions 210 of the substrate 110 adjacent to the gate stack 150, as shown in FIG. 2.

Figure 2:
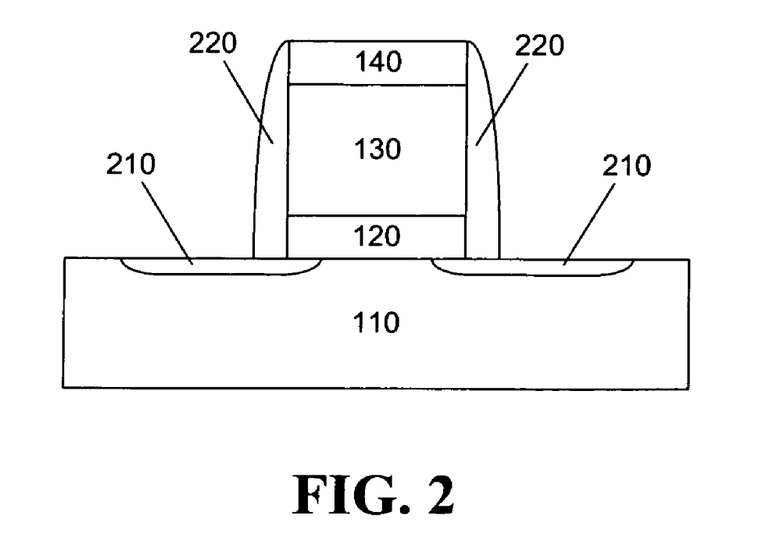
FIG. 2 is an illustration of the device of FIG. 1 with spacers formed on the sides of the gate electrode.

FIG. 2 is an illustration of the device of FIG. 1 after forming the doped portions 210 in the substrate 110 and forming spacers 220 on the sides of the gate electrode 150. When exposed to an appropriate etchant, the doped portion 210 will etch at a rate that is higher than the etch rate of the surrounding substrate material. One of the doped portions 210 will serve as a portion of a source region, including a self-aligned epitaxial source extension, for the MOS transistor being formed. The other doped portion 210 will serve as a portion of a drain region, including a self-aligned epitaxial drain extension, for the MOS transistor. In the implementation shown, regions of the doped portions are sited below the gate dielectric layer 120. In the various implementations of the invention, the size of the doped portions 210, including their depth, may vary based on the requirements of the MOS transistor being formed.

The spacers 220 may be formed using conventional materials, including but not limited to silicon oxide or silicon nitride. The width of the spacers 220 may be chosen based on design requirements for the MOS transistor being formed. In accordance with implementations of the invention, the width of the spacers 220 is not subject to design constraints imposed by the formation of the epitaxial source and drain extensions.

After the spacers 220 are formed on the substrate 110, a dry etch process may be carried out to etch the doped portions 210 and to etch portions of the substrate to form cavities in which source/drain regions and source/drain extensions may be formed. The etched cavities are adjacent to the gate stack 150. The etched cavities may be formed to a depth that falls between 50 nm and 1500 nm, which is deeper than the doped regions. The etching process will therefore remove a minimal amount of substrate material subjacent to the doped portions 210.

The dry etch process employs an etchant recipe that complements the dopant used in the ion implantation process to increase the etch rate of the doped regions. This enables the etching process to remove the doped regions at a faster rate than the remainder of the substrate. As such, with an appropriate increase in etch rate, the etching process can remove substantially all of the material from the doped portions 210 by the time the etching of the cavities is complete. This includes portions of the doped regions that undercut the spacers and the gate dielectric layer, thereby defining the self-aligned extension architecture of the transistor. Increasing the etch rate of the doped portions 210 enables the etched source and drain extension cavities to undercut the spacers and the gate dielectric layer.

In accordance with implementations of the invention, the dry etch process may use a chlorinated chemistry that takes place in a plasma reactor. In one implementation, the etchant recipe may consist of a combination of $NF_3$ and $Cl_2$ with argon or helium used as a buffer or carrier gas. The flow rate for the active etchant species may vary between 50 and 200 standard cubic centimeters per minute (SCCM) while the flow rate of the carrier gas may vary between 150 and 400 SCCM. A high energy plasma may be employed at a power that ranges from 700 W to 1100 W with a low RF bias of less than 100 W. The reactor pressure may range from around 1 pascal (Pa) to around 2 Pa.

In another implementation, the etchant chemistry may consist of a combination of HBr and $Cl_2$. The flow rate for the etchant species may vary between 40 SCCM and 100 SCCM. A high energy plasma may be employed at a power that ranges from around 600 W to around 1000 W with a low RF bias of less than 100 W. The reactor pressure may range from around 0.3 Pa to around 0.8 Pa. In another implementation, the etchant chemistry may consist of a combination of $SF_6$ and $Cl_2$. The $SF_6$ flow rate may vary between 3 SCCM and 10 SCCM and the $Cl_2$ flow rate may vary between 20 SCCM and 60 SCCM. A high energy plasma may be employed at a power that ranges from around 400 W to around 900 W with no RF bias or an RF bias of less than 50 W. In this implementation, the $SF_6$ flow rate and the reactor pressure may be kept low to reduce the rate of removal and to maximize control. For instance, the reactor pressure may range from around 0.1 Pa to around 0.5 Pa. In yet another implementation, the etchant chemistry may consist of a combination of Ar and $Cl_2$. Here, the flow rate for the etchant species may vary between 40 SCCM and 80 SCCM. A medium energy plasma may be employed at a power that ranges from around 400 W to around 800 W with a high RF bias of between around 100 W and 200 W. The reactor pressure may range from around 1 Pa to around 2 Pa.

Figure 3:
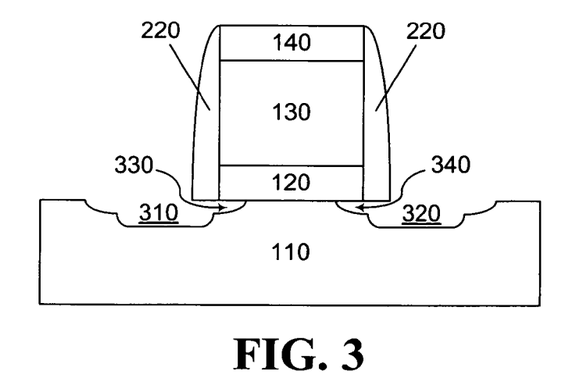
FIG. 3 is an illustration of the device of FIG. 2 after etching portions of the substrate to form source/drain and source/drain extension cavities.

FIG. 3 is an illustration of the device of FIG. 2 after etching portions of the substrate 110 to form source/drain and source/drain extension cavities. As shown, a source region cavity 310 and a drain region cavity 320 are formed. Furthermore, a source extension cavity 330 and a drain extension cavity 340 have been formed by the etching of the doped portions 210. The thickness of the spacers 220 has minimal impact on the etching of the source extension cavity 330 and the drain extension cavity 340 due to the use of dopants and etchant recipes that increase the etch rate of the doped portions 210.

After the dry etch process has completed, a wet etch process may be applied to clean and further etch the source region cavity 310, the source extension cavity 330, the drain region cavity 320, and the drain extension cavity 340. Conventional wet etch chemistries known in the art for cleaning silicon and oxide material may be used. For instance, wet etch chemistries capable of removing silicon along its crystallographic planes may be used.

Figure 4:
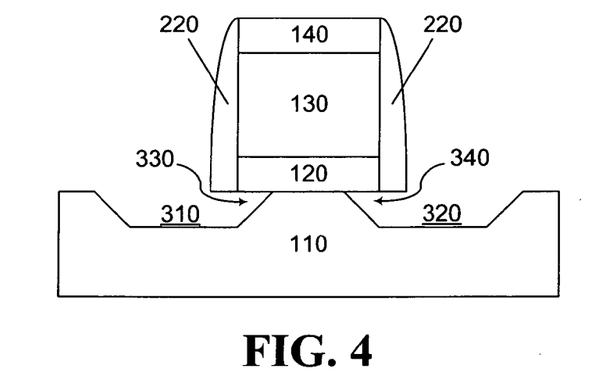
FIG. 4 is an illustration of the device of FIG. 3 after wet etching the source/drain and source/drain extension cavities.

The wet etch serves at least two objectives. First, the wet etch removes contaminants such as carbon, fluorine, chlorofluorocarbons, and oxides such as silicon oxide to provide a clean surface upon which subsequent processes may be carried out. Second, the wet etch removes a thin portion of the substrate along the <111> and <001> crystallographic planes to provide a smooth surface upon which a high quality epitaxial deposition may occur. The thin portion of the substrate that is etched away may be up to 5 nm thick and may also remove residual contaminants. As shown in FIG. 4, the wet etch causes edges of the source region cavity 310, the source extension cavity 330, the drain region cavity 320, and the drain extension cavity 340 to follow the <111> and <001> crystallographic planes. It should also be noted that the source and drain extensions 330 and 340 do not have the bulleted profile that occurs in conventional processing.

After the etching process, the source and drain region cavities, including the source and drain extensions, may be filled with a compound film such as a silicon germanium alloy using a selective epitaxial deposition process. The epitaxial deposition process is used to form the source and drain regions and the source and drain extensions in one process. In some implementations, the silicon alloy may be in-situ doped silicon germanium, whereby the in-situ doped silicon germanium may be doped with one or more of boron and/or phosphorus.

In implementations, the silicon germanium alloy material deposited in the source and drain region cavities has a lattice spacing that is different than the lattice spacing of the material or materials used to form the substrate 110. The difference in lattice spacing induces a tensile or compressive stress in the channel region of the MOS transistor that is accentuated by depositing the high germanium compound alloy in the source extension cavity 330 and the drain extension cavity 340.

In accordance with implementations of the invention, for a PMOS transistor, the source region cavity 310 and the drain region cavity 320 may be filled with a graded germanium silicon alloy such as the graded high-germanium content silicon germanium region according to one or methods such as the embodiment described below in FIG. 15. The graded germanium silicon alloy may be epitaxially deposited with a graded germanium concentration that may range from 10 atomic % to 50 atomic %. In further implementations, the graded germanium silicon alloy may be further doped in situ with boron. The boron concentration may range from $2 \times 10^{19}/cm^3$ to $7 \times 10^{20}/cm^3$. In this embodiment, the thickness of the graded germanium silicon alloy may range from 40 Å to 1500 Å.

Figure 5:
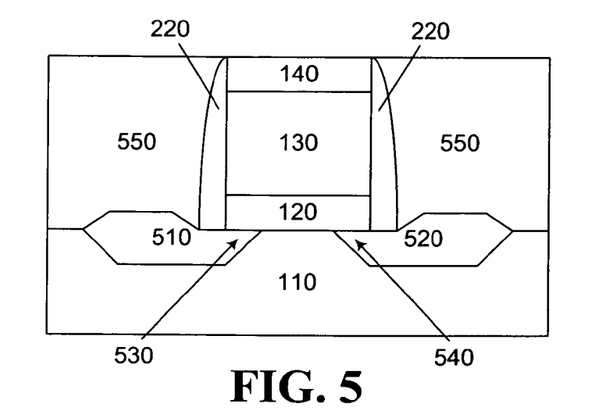
FIG. 5 is an illustration of the device of FIG. 4 after forming source/drain and source/drain extension regions.
Figure 14:
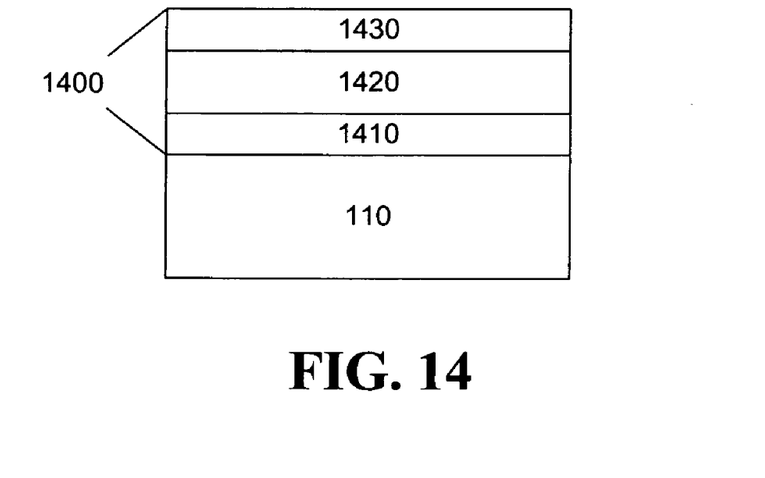
FIG. 14 is an illustration of a graded high-germanium content silicon-germanium region on a substrate.

FIG. 5 is an illustration of the device of FIG. 4 in which the source region cavity 310 has been filled with a graded high-germanium content silicon-germanium stack 1400, further described in FIG. 14, to form a source region 510 and the drain region cavity 320 has been filled with a graded high-germanium content silicon-germanium stack 1400, also further described in FIG. 14, to form a drain region 520. The extensions have been filled with the graded high-germanium content silicon-germanium stack 1400 to form an epitaxial source extension 530 and an epitaxial drain extension 540.

As shown in FIG. 5, unlike conventional source and drain tip regions formed through implant and diffusion techniques and having no clear boundary between the tip regions and the channel region, the self-aligned, epitaxial source and drain extensions of the invention have an abrupt boundary. As a result, the interface between the epitaxial source/drain extensions and the channel region is clear and well-defined. On one side of the interface is the epitaxially deposited doped silicon material and on the other side of the interface is the substrate material that makes up the channel region. The dopants in the epitaxial source/drain extensions remain substantially or completely within the extensions and do not tend to diffuse into the channel region, thereby enabling the epitaxial source and drain extensions to bring the heavily doped silicon material in very close proximity to the channel region relative to conventional techniques. As will be appreciated by those of skill in the art, this in turn enables the gate length to be scaled down without having to shorten the channel region.

Forming the epitaxial source and drain extensions in relatively close proximity to the channel region also imparts a larger hydrostatic stress on the channel. This stress increases the strain within the channel, thereby increasing mobility in the channel and increasing drive current. This stress can be further amplified by increasing the doping of the epitaxial source and drain extensions, which is easily controlled during the epitaxial deposition of the graded germanium silicon alloy.

As will be appreciated by those of skill in the art, the planar MOS device 100 may undergo further MOS processing, such as replacement gate oxide processes, replacement metal gate processes, annealing, or salicidation processes, that may further modify the device and/or provide the necessary electrical interconnections. For instance, after the epitaxial deposition of the source/drain regions and the source/drain extension, an interlayer dielectric (ILD) may be deposited and planarized over the device. The ILD may be formed using materials known for the applicability in dielectric layers for integrated circuit structures, such as low-k dielectric materials. Such dielectric materials include, but are not limited to, oxides such as silicon dioxide ($SiO_2$) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer may include pores or other voids to further reduce its dielectric constant. FIG. 5 illustrates an ILD layer 550 that has been deposited over the planar MOS device 100.

The present invention is not limited to the formation of planar MOS devices comprising graded high germanium content silicon-germanium regions. For example, devices with a three-dimensional architecture, such as tri-gate devices, may benefit from the above process. FIGS. 6-12 provide illustrative views representing the formation of strain-inducing source/drain regions in a non-planar device in accordance with an embodiment of the present invention.

Figure 6:
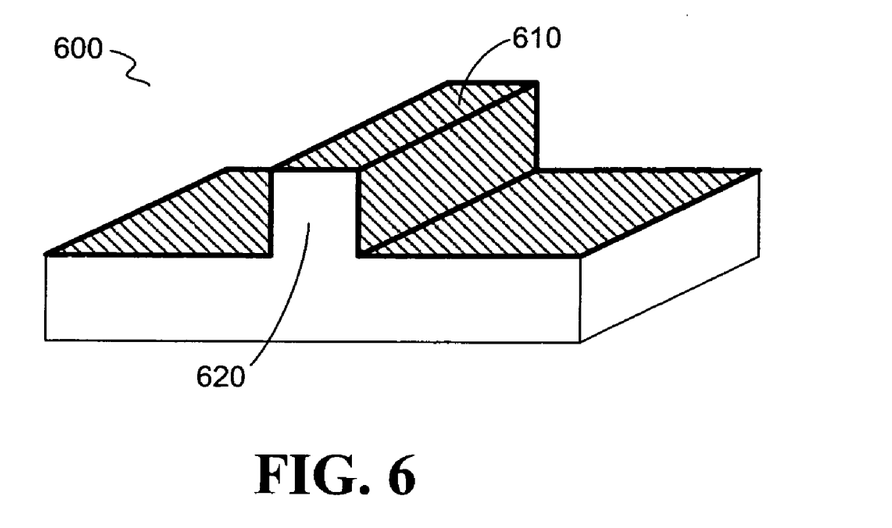
FIG. 6 is an illustration of a multi-gate device with a dielectric layer on a multi-gate body.

FIG. 6 is an illustration of a multi-gate device 600 after depositing a multi-gate dielectric layer 610 on a multi-gate body 620. The multi-gate transistor in FIG. 6 is a tri-gate transistor with three substantially equal length gates. In another embodiment (not shown) the multi-gate transistor is a dual-gate field effect transistor (FinFET) with two gates. The multi-gate dielectric layer 610 may comprise at least one of silicon oxide or a high-K material. The high-K material comprises at least one of lanthanum oxide, tantalum oxide, titanium oxide, hafnium oxide, zirconium oxide, lead-zirconate-titanate, barium-strontium-titanate, or aluminum oxide. The multi-gate dielectric layer 610 is deposited as a conformal layer on the multi-gate body 620 using methods known to persons having ordinary skill in the art, such as plasma enhanced chemical vapor deposition (PECVD), high density chemical vapor deposition (HDCVD), molecular organic chemical vapor deposition (MOCVD), Atomic Layer Deposition (ALD), or sputtering. The multi-gate body 620 may comprise silicon, Germanium, or III-V semiconductor such as gallium arsenide (GaAs) and indium antimonide (InSb). The multi-gate body 620 may be formed from an epitaxial layer, a monocrystalline substrate or from a silicon-on-insulator (SOI) layer.

Figure 7:
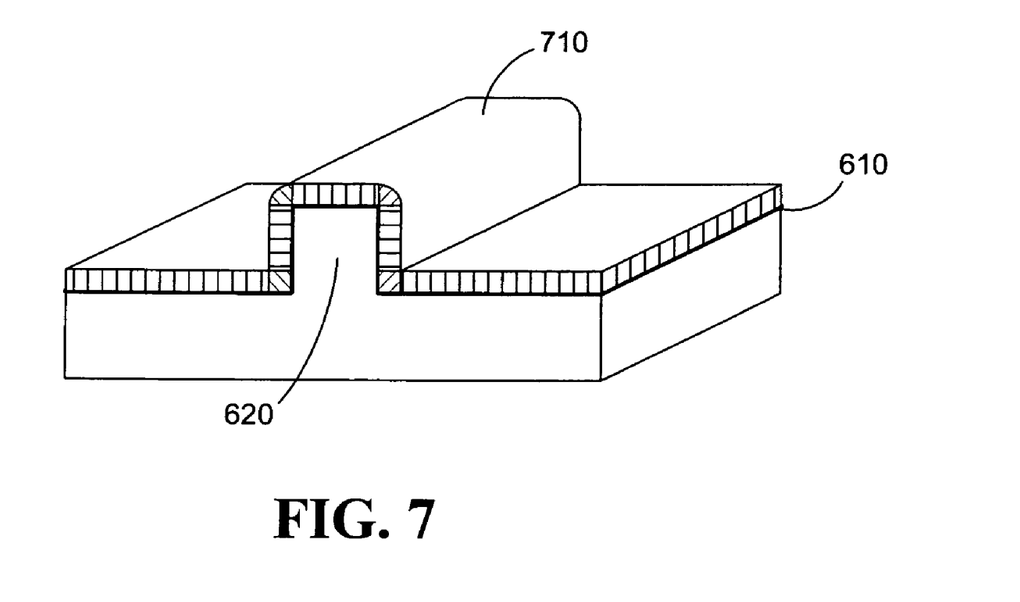
FIG. 7 is an illustration of the device of FIG. 6 after depositing a workfunction metal layer on the dielectric layer.

The illustration in FIG. 7 depicts the multi-gate device 600 in FIG. 6 after depositing a conformal workfunction metal layer 710 at a desired thickness on the multi-gate dielectric layer 610. A workfunction metal is a metal with a known work function, which is an inherent characteristic of the metal expressed in units of electron volts (eV). In one embodiment, the workfunction metal layer 710 comprises at least one of titanium nitride, tantalum nitride, or another transition nitride metal. A workfunction metal layer thickness is a function of the targeted threshold voltage ($V_t$) for the multi-gate device.

In one embodiment, the workfunction metal layer is formed using a directional sensitive physical vapor deposition (PVD) process. Deposition of the workfunction metal layer 710 using the PVD process is characterized by a microstructure that comprises columnar grains that nucleate at a surface and grow normal to the surface. In another embodiment, a workfunction metal layer 710 with columnar grains may be formed using layering techniques including molecular beam epitaxy (MBE), chemical vapor deposition (CVD), electroplating, or evaporation.

Figure 8:
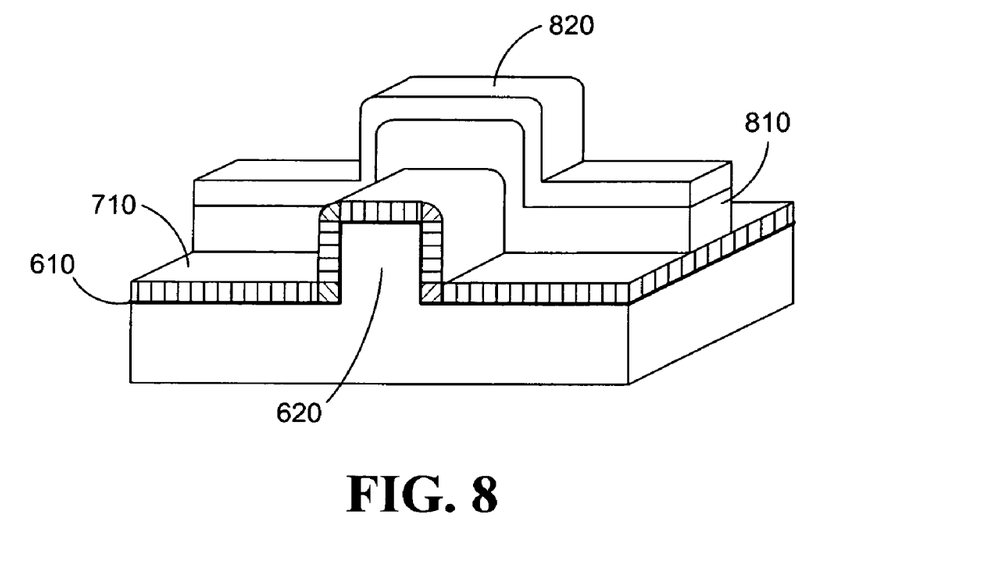
FIG. 8 is an illustration of the device of FIG. 7 after forming a protective mask on the workfunction metal layer.

FIG. 8 illustrates the multi-gate device 600 in FIG. 7 after forming a protective mask comprising a multi-gate electrode 810, such as polysilicon, and a hard mask 820 on a portion of the workfunction metal layer 710. The protective mask is formed by a series of deposition, lithography, and etch processes known to one ordinarily skilled in the art. The multi-gate electrode 810 may be doped or un-doped and the hard mask 820 may comprise silicon nitride or silicon oxynitride.

Figure 9:
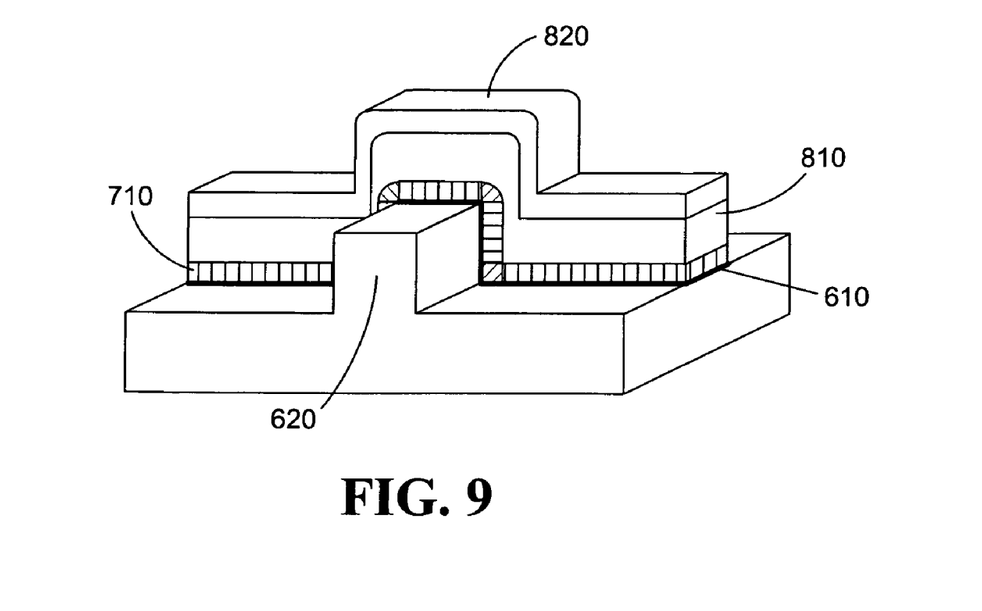
FIG. 9 is an illustration of the device of FIG. 8 after anisotropically etching the workfunction metal layer to form a gate electrode.

FIG. 9 illustrates the multi-gate device 600 in FIG. 8 after anisotropically etching an exposed region of the workfunction metal layer 710. The exposed region of the workfunction metal layer 710 is etched using a wet etch process utilizing a wet-etchant comprising a base and an oxidant. The appropriate wet-etch process is selectively designed to etch the workfunction metal layer 710 without significantly eroding the polysilicon 810 or the hard mask 820. The base may comprise at least one of ammonium hydroxide ($NH_4OH$), tetramethylammonium hydroxide (TMAH), or potassium hydroxide (KOH). The oxidant may comprise at least one of hydrogen peroxide ($H_2O_2$) or ozone ($O_3$). The workfunction metal layer 710 is etched anisotropically, meaning that an etch rate in the direction normal to a surface is much higher than in a direction parallel to the surface. The workfunction metal layer 710 etches anisotropically because an etch rate of the workfunction metal layer 710 in a direction normal to the gate surface is much faster than an etch rate of the workfunction metal layer 710 in a direction parallel to the gate surface. This allows protected regions of the workfunction metal layer 710 to remain largely intact while the exposed regions of the workfunction metal layer 710 are etched by the wet-etchant.

Figure 10:
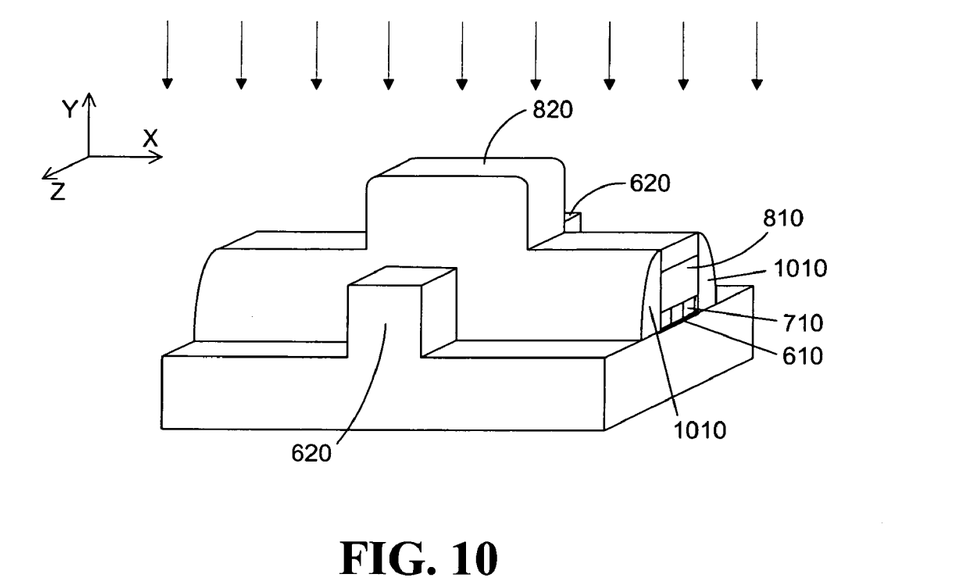
FIG. 10 is an illustration of the device of FIG. 9 after forming gate isolation spacers on the gate electrode.

FIG. 10 is an illustration of the device of FIG. 9 after forming gate isolation spacers 1010 adjacent to the multi-gate electrode 810. The gate isolation spacers 1010 protect the multi-gate electrode 810, the workfunction metal layer 710, and the multi-gate dielectric layer 610 during subsequent processing.

Figure 11:
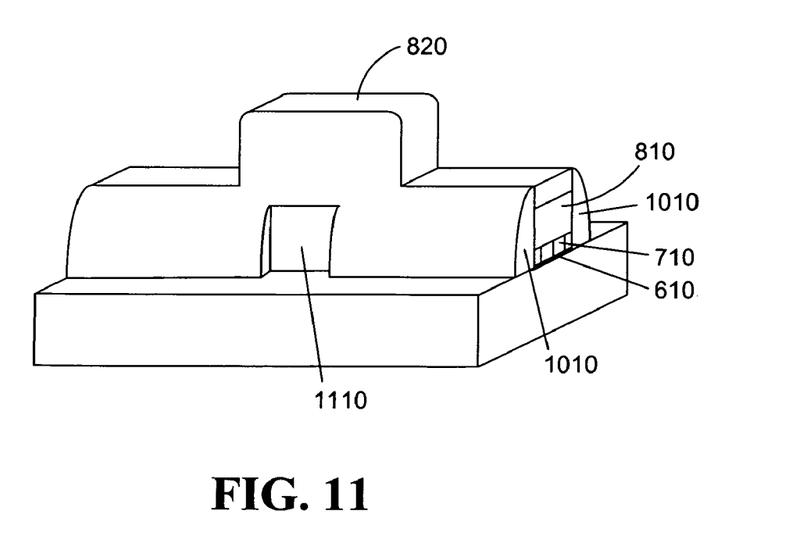
FIG. 11 is an illustration of the device of FIG. 10 after removing portions of the body to provide a channel region.
Figure 12:
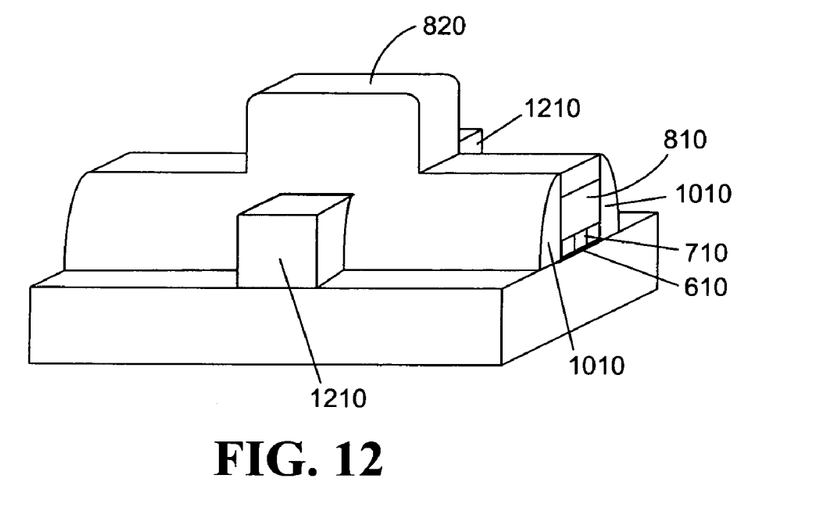
FIG. 12 is an illustration of the device of FIG. 11 after forming epitaxial source/drain regions.

FIG. 11 is an illustration of the device of FIG. 10 after removing portions of the multi-gate body 620 to provide a multi-gate channel region 1110. FIG. 12 is an illustration of the device of FIG. 11 after epitaxially forming source and drain regions 1210. The epitaxially formed source/drain regions 1210 are formed using a graded high germanium content silicon-germanium film stack. The epitaxially formed source/drain regions 1210 may be formed using a graded high-germanium content silicon-germanium film stack 1400, further described in FIG. 14, according to one or methods such as the embodiment described below in FIG. 15.

Figure 13:
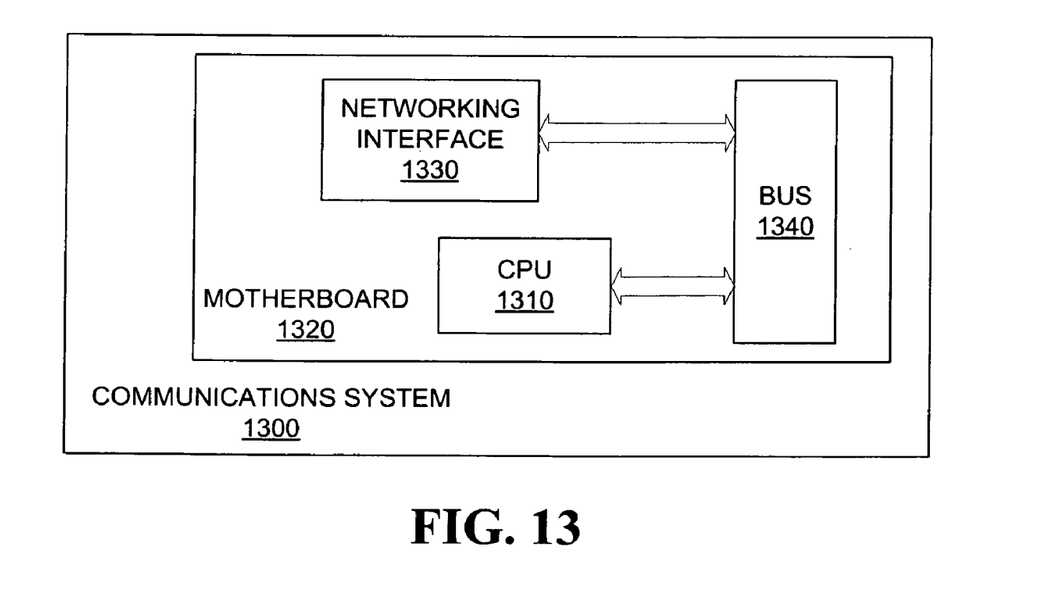
FIG. 13 illustrates a system with a central processing unit comprising a graded high germanium compound film.

FIG. 13 illustrates a communications system 1300 with a central processing unit (CPU) 1310 for processing data comprising transistors with a graded high-germanium content silicon-germanium region in accordance with one embodiment. The communications system 1300 may include a motherboard 1320 with the CPU 1310, and a networking interface 1330 coupled to a bus 1340. More specifically, the CPU 1310 may comprise the graded high-germanium content silicon-germanium region and/or its method of fabrication. Depending on the applications, the communications system 1300 may additionally include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described graded high germanium content silicon-germanium region and/or its method of fabrication. In various embodiments, communications system 1300 may be a personal digital assistant (PDA), a mobile device, a tablet computing device, a laptop computing device, a desktop computing device, a set-top box, an entertainment control unit, a digital camera, a digital video recorder, a CD player, a DVD player, or other digital device of the like.

Figure 15:
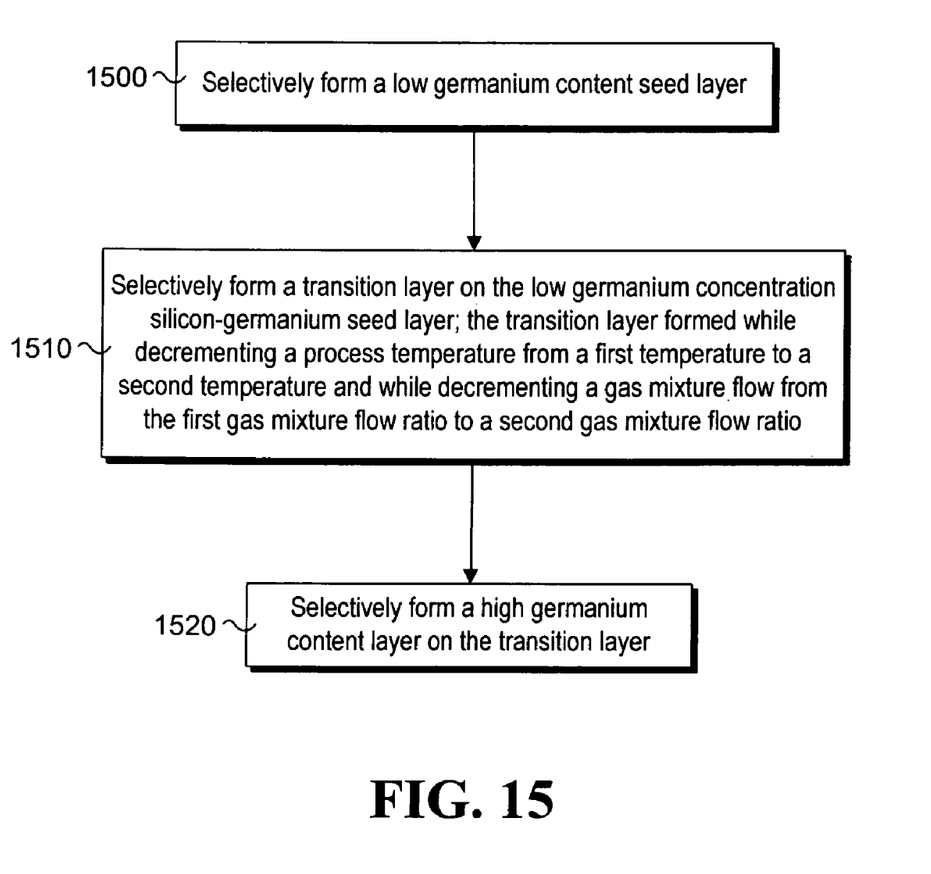
FIG. 15 is a flowchart describing one embodiment of a fabrication process used to form a strained semiconductor device with a graded high-germanium content silicon-germanium region.

FIG. 15 is a flowchart describing one embodiment of a fabrication process used to form a strained semiconductor device comprising a graded high-germanium content silicon-germanium stack 1400 with a crystalline structure, as shown in FIG. 14. In one embodiment, the graded high-germanium content silicon-germanium stack 1400 comprises a stack of layers grown at a pressure ranging between 10-150 Torr (T) using a carrier gas such as hydrogen (H2) at a flow ranging between 10-40 standard liters per minute (slm) on a substrate 110 with an epitaxial deposition process using a deposition tool such as an Applied Materials Centura® or an ASM Epsilon® tool.

A bottom layer is selectively formed preferentially on exposed regions of the substrate 110 in element 1500. In one embodiment, the bottom layer is a silicon-germanium seed layer 1410 with a relatively low germanium content ranging between 20-25 atomic weight % and deposited for a time ranging between 10-30 seconds to provide a final thickness ranging between 100 Å-300 Å. The silicon-germanium seed layer 1410 may optionally be doped with boron to a concentration ranging between $5.0 \times 10^{19}$ atoms/cm$^3$ to $1.5 \times 10^{20}$ atoms/cm$^3$. The silicon-germanium seed layer 1410 may be deposited in a temperature range between 700-800 degrees Celsius (° C.) or more preferably between 745-765° C. Further, the silicon-germanium seed layer 1410 may be formed using a mixture of process gases comprising hydrogen chloride (HCl), dichlorosilane (DCS), germane (GeH4), and diborane (B2H6) with a HCl flow between 20-200 standard cubic centimeters per minute (sccm), DCS flow between 10-100 sccm, germane flow between 20-200 sccm using a mixture of 1% germane and hydrogen balance, and diborane flow between 10-75 sccm.

A transition layer 1420 is selectively formed on silicon-germanium seed layer 1410 in element 1510 to provide a very gentle transition between a base nucleation layer, such as the silicon-germanium seed layer 1410, to a high germanium content layer 1430. In one embodiment, a lower portion of the transition layer 1420 adjacent and/or close to the silicon-germanium seed layer 1410 may have a germanium content that is substantially equal to the silicon-germanium seed layer 1410, 20-25 atomic weight %, at a silicon-germanium seed layer 1410/transition layer 1420 interface. Further, an upper portion of the transition layer 1420 adjacent and/or close to a high germanium content layer 1430 may have a germanium content that is substantially equal to the high germanium content layer 1430, substantially ranging between 40-55 atomic weight % at a transition layer 1420/high germanium content layer 1430 interface. A thickness of the transition layer 420 may range between 150 Å and 450 Å.

The transition layer 1420 may be formed with an epitaxial process in a dynamic manner by decrementing a process temperature from a starting temperature substantially equal to the formation temperature of the silicon-germanium seed layer 1410, ranging between 700-800° C. or more preferably between 745-765° C. The formation temperature is decremented in a substantially linear manner from the starting temperature to an ending temperature. The ending temperature or second temperature, in one embodiment, is substantially between 25-100° C. lower than the starting temperature, or first temperature, or more preferably is approximately 45-55° C. lower than the starting temperature or first temperature. In one embodiment, the transition layer 1420 is deposited over a time period ranging between 20-60 seconds.

The transition layer 1420 is further formed epitaxially by decrementing a gas mixture flow of DCS, HCl, and $GeH_4$ from a higher flow to a lower flow during the formation of the transitional layer 1420. If doping the transition layer 1420, the diborane flow is increased while forming the transitional layer 1420 to provide a boron concentration substantially equal to or greater than $2.0 \times 10^{20}$ atoms/cm$^3$ at or near the transition layer 1420/high germanium content layer 1430 interface. Formation of the transition layer 1420 in this embodiment provides a graded silicon-germanium film that is selectively formed at a growth rate of approximately 300 Å/minute with equal to or less than 2% film relaxation and health film morphology.

The high germanium content layer 1430 is selectively formed in element 1520 on the transitional layer 1420 to provide a strained transistor structure. In one embodiment, the high germanium content layer 1430 is formed while leaving the process recipe parameters constant after the formation of a final portion of the transition layer 1420. The high germanium content layer 1430 in this embodiment is formed with a thickness ranging between 300 Å-600 Å and a germanium content ranging between 40-55 atomic weight %. The high germanium content layer 1430 may optionally be doped with boron to a concentration ranging between $2.0 \times 10^{20}$ atoms/cm$^3$ to $3.0 \times 10^{20}$ atoms/cm$^3$.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a crystalline compound film, comprising:
    selectively forming a low germanium content seed layer;
    selectively forming a transition layer on the low germanium content seed layer; the transition layer formed while decrementing a process temperature from a first temperature to a second temperature, and while decrementing a dichlorosilane, hydrogen chloride, and germane flow from a higher flow to a lower flow; and
    selectively forming a high germanium content layer on the transition layer.

2. The method of claim 1, wherein the transition layer is formed while increasing a diborane flow from a lower flow to a higher flow.

3. The method of claim 1, wherein the first temperature is selected from a range between 700° C. and 800° C.

4. The method of claim 1, wherein the second temperature is between 25 to 100° C. lower than the first temperature.

5. The method of claim 1, wherein the low germanium content seed layer is doped with boron to a concentration ranging between $5.0 \times 10^{19}$ atoms/cm$^3$ to $1.5 \times 10^{20}$ atoms/cm$^3$.

6. The method of claim 1, wherein the high germanium content layer is doped with boron to a concentration ranging between $2.0 \times 10^{20}$ atoms/cm$^3$ to $3.0 \times 10^{20}$ atoms/cm$^3$.

7. A method comprising:
    forming a gate stack and a pair of spacers on a multi-gate body, wherein the spacers are formed on laterally opposite sides of the gate stack;
    etching the multi-gate body at regions adjacent to the spacers; and
    selectively depositing a graded high-germanium content silicon germanium stack to form a source region and a drain region directly adjacent to the multi-gate body, wherein the graded high-germanium content silicon germanium stack is formed of a silicon-germanium seed layer, a transition layer, and a high germanium content layer, and wherein the transition layer is formed while decrementing a dichlorosilane, hydrogen chloride, and germane flow from a higher flow to a lower flow.

8. The method of claim 7, wherein the transition layer is formed while increasing a diborane flow from a lower flow to a higher flow.

9. The method of claim 7, wherein the transition layer is formed beginning with a first temperature selected from a range between 700° C. and 800° C.

10. The method of claim 7, wherein the transition layer is formed ending with a second temperature selected from a range between 25 to 100° C. lower than the first temperature.

* * * * *